United States Patent
Nishiki et al.

(10) Patent No.: US 6,652,342 B1
(45) Date of Patent: Nov. 25, 2003

(54) WIRING BOARD AND GAS DISCHARGE TYPE DISPLAY APPARATUS USING THE SAME

(75) Inventors: Masashi Nishiki, Yokohama (JP); Michifumi Kawai, Tokyo (JP); Ryohei Satoh, Yokohama (JP); Shigeaki Suzuki, Fujisawa (JP); Akira Yabushita, Yokohama (JP); Masahito Ijuin, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/299,559

(22) Filed: Apr. 27, 1999

(30) Foreign Application Priority Data

Apr. 28, 1998 (JP) .......................................... 10-118106

(51) Int. Cl.[7] ................................................. H01J 9/02
(52) U.S. Cl. ...................... 445/24; 174/253; 174/126.4
(58) Field of Search ................................. 313/582, 583, 313/584, 585, 586; 445/24; 174/253, 126.4

(56) References Cited

U.S. PATENT DOCUMENTS

| 5,182,489 A | * | 1/1993 | Sano ........................... 313/485 |
| 5,534,970 A | * | 7/1996 | Nakashima et al. ......... 359/589 |
| 5,972,564 A | * | 10/1999 | Kawana et al. ............. 313/582 |
| 6,184,621 B1 | * | 2/2001 | Horiuchi et al. ............ 313/586 |

OTHER PUBLICATIONS

N. Microdevice; "Flat Panel Display 1996", 1995; pp. 208–215, (No month).

* cited by examiner

Primary Examiner—Kenneth J. Ramsey
(74) Attorney, Agent, or Firm—Mattingly, Stanger & Malur, P.C.

(57) ABSTRACT

A gas discharge type display apparatus includes a front substrate having a plurality of first electrodes and a back substrate having a plurality of second electrodes and at least ones of the first and second electrodes are made of the photosensitive material containing silver exposed by using the laser thereby, making a mask unnecessary.

24 Claims, 5 Drawing Sheets

(a)

(b)

(c)

(d)

(e)

(f)

WIRING BOARD AND GAS DISCHARGE TYPE DISPLAY APPARATUS USING THE SAME

BACKGROUND OF THE INVENTION

1. Field of the Invention

The invention relates to a wiring board in which a wiring pattern is formed on a substrate and a gas discharge type display apparatus using such a wiring board.

2. Description of the Related Art

According to a gas discharge type display apparatus such as a plasma display or the like, since a display is performed by a self light emission, an angle of visibility is wide and a display can be easily seen. Such a display apparatus has features that a thin display apparatus can be manufactured and a large screen can be realized and the like. An application of such a display apparatus to a display apparatus of information terminal equipment or a high definition television receiver has been started. The plasma display is mainly classified into a DC driving type and an AC driving type. According to the plasma display of the AC driving type among them, a luminance is high owing to a memory function of a dielectric layer covering electrodes and a life enough to endure an actual use can be obtained due to the formation of a protecting layer or the like. Thus, the plasma display has been put into practical use as a multi-purpose video monitor.

FIG. 6 is a perspective view showing a structure of a plasma display panel which has been put into practical use. To make it easy to see, a front substrate 100 is illustrated in the diagram so as to be away from a back substrate 200 and a discharge space area 300.

The front substrate 100 has a structure such that display electrodes 600 made of a transparent electrode material such as ITO (Indium Tin Oxide), tin oxide ($SnO_2$), or the like, bus electrodes 700 made of a low resistance material, a dielectric layer 800 made of a transparent insulating material, and a protecting layer 900 made of a material such as magnesium oxide (MgO) or the like are formed on a front glass substrate 400.

The back substrate 200 has a structure such that address electrodes 1000, barrier ribs 1100, and a fluorescent layer 1200 are formed on a back glass substrate 500. Although not shown, a dielectric layer is also formed on the address electrodes 1000.

By adhering the front substrate 100 and back substrate 200 so that the display electrodes 600 and address electrodes 1000 almost perpendicularly cross, the discharge space area 300 is formed between the front substrate 100 and back substrate 200.

In the gas discharge type display apparatus, an AC voltage is applied between a pair of display electrodes 600 formed on the front substrate 100 and a voltage is applied between the address electrodes 1000 formed on the back substrate 200 and the display electrodes 600, thereby generating an address discharge and allowing predetermined discharge cells to generate a main discharge. By ultraviolet rays which are generated by the main discharge, the fluorescent materials 1200 of red, green, and blue separately coated on the discharge cells are allowed to emit light, thereby displaying.

A conventional technique of such a gas discharge type display apparatus has been disclosed in, for example, "Flat Panel Display 1996", edited by Nikkei Microdevice, pages 208–215, 1995.

A method of forming the bus electrodes 700 provided for the front substrate 100 and the address electrodes 1000 provided for the back substrate 200 will be described further in detail. FIGS. 4 and 5 show an example of forming the address electrode 1000 onto the back glass substrate 500. Since the bus electrodes 700 provided for the front substrate 100 are also formed by almost similar steps, its description is omitted here.

First referring now to FIG. 4, Cr/Cu/Cr layers (1000a to 1000c) serving as an address electrode 1000 and a resist 2500 to form a pattern of the address electrode 1000 are sequentially formed on the back glass substrate 500 so as to be laminated by using a film forming method such as sputtering method, evaporation deposition method, or the like and by using a resist forming method such as rotational coating, laminating, or the like (step (a): film forming step). Subsequently, the resist 2500 is exposed and developed so as to obtain a desired pattern of the address electrode 1000 (steps (b) and (c): photolithographic step). The Cr layer 1000a is etched in a desired pattern by using an etchant for Cr (step (d): etching step). Subsequently, the exposed and developed resist 2500 is removed and the resist 2500 is again formed (steps (e) and (f)). Subsequently, referring to FIG. 5, by repeating the above processes with respect to each of the Cu layer 1000b and Cr layer 1000c (steps (g) to (o)), the address electrode 1000 is formed on the back glass substrate 500.

Although such a process is usually called a photolithograph-etching process, such a process has difficulties that the number of steps is large and costs are high because the resist formation and the like are included. Although the forming method of the Cr/Cu/Cr wirings has been described here, there are similar difficulties so long as a resist is used even if wirings are formed by using another single material. Although a mask to expose and form the resist pattern is necessary to form a resist, according to the gas discharge type display apparatus, since it ordinarily has a large screen, a positional deviation occurs more easily as a position of the mask approaches a periphery and it is difficult to accurately form wirings. It is also difficult to realize a highly accurate position matching itself of the mask. The mask is expensive.

As a wiring forming method in which the resist is made unnecessary, there is a method whereby a photosensitive material (for example, silver material having photosensitivity) is used and the photosensitive material is exposed and developed by a light source such as a mercury lamp or the like, thereby forming wirings.

In this case as well, however, in case of exposing the photosensitive material, a mask on which a desired wiring pattern has been formed is necessary and the difficulties in case of using the mask as mentioned above still remain. That is, there are the difficulties of the positional deviation at the time of formation of the wirings, the positional mismatching of the mask, and the costs of the mask.

SUMMARY OF THE INVENTION

It is an object of the invention to provide an exactly novel process which makes a mask unnecessary. That is, an object of the invention is to provide a gas discharge type display apparatus in which wirings are formed by exactly novel processes without needing a mask.

According to the invention, when wirings are formed by using a photosensitive material, a wiring pattern is directly drawn by a laser and the photosensitive material is exposed by the laser drawing, thereby making the conventional mask unnecessary. That is, according to the invention, to accomplish the above object, a front substrate having a plurality of first electrodes and a back substrate having a plurality of second electrodes are provided, and at least ones of the first and second electrodes are made of a photosensitive material containing silver exposed by using the laser.

As mentioned above, by directly drawing and exposing the photosensitive material with the laser, the conventional exposing process using the mask is unnecessary, so that the difficulties of the positional deviation at the time of the formation of the wirings due to the mask, the positional mismatching of the mask, and the costs of the mask can be solved. Therefore, according to the gas discharge type display apparatus of the invention, there is no positional mismatching of the mask and high positioning precision of the wirings can be easily assured, namely, the wirings can be formed at a desired position as compared with the conventional apparatus, so that uniform discharging characteristics can be obtained on the whole panel surface.

The wirings can be also formed at low costs.

Silver is preferable as a photosensitive material because of a wiring resistance or the like.

DETAILED DESCRIPTION OF THE EMBODIMENTS

An embodiment of the invention will now be described hereinbelow with reference to the drawings.

Figure 1:
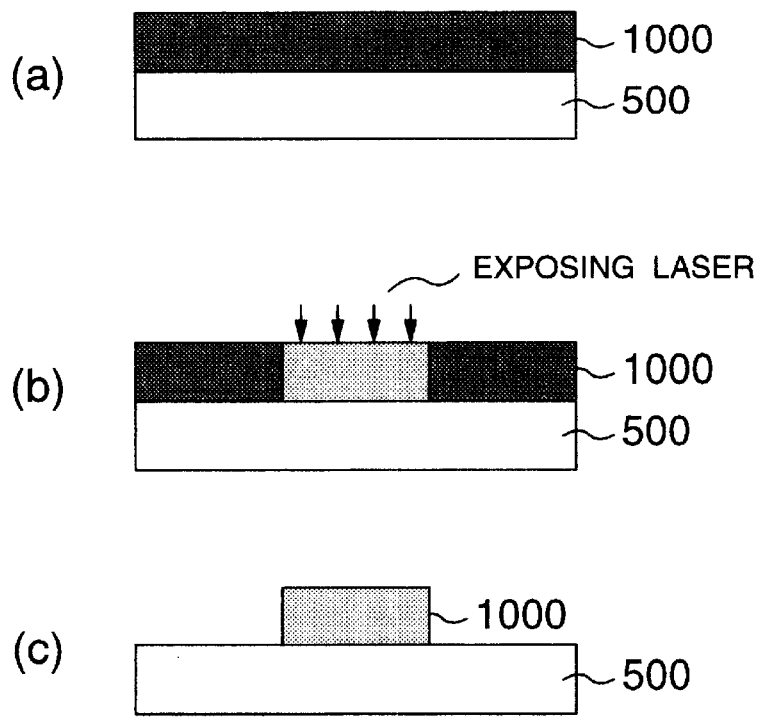
FIG. 1 is a cross sectional view showing an embodiment of the invention.

FIG. 1 shows an example of processes to form address electrodes onto a back glass substrate.

FIG, 1(*a*) shows a state where a material 1000 having photosensitivity containing silver is coated onto the glass substrate 500 by a dichoter and is pre-dried.

FIG. 1(*b*) shows a state where a desired pattern is drawn in the material 1000 containing silver by using a YAG (Yttrium Aluminum Garnet) laser having an exposing apparatus (not shown). A beam irradiated from the YAG laser uses a wavelength of a third harmonic so that the material containing silver can be photosensed.

FIG. 1(*c*) relates to a developing step and shows a state where a non-drawing portion which is not drawn by the laser is removed by a developing liquid. After that, a heat treatment is performed to improve the reliability of the wirings.

After that, although not shown, a dielectric layer, a barrier, and a fluorescent layer are sequentially formed and a back substrate is completed.

By using the processes as mentioned above, since the wiring pattern is directly exposed by the laser, the conventional mask is unnecessary and the reduction of costs can be realized. Since the area exposed by the laser becomes the wiring pattern, the conventional etching process using the resist is also unnecessary and a defective disconnection or the like based on the etching process is eliminated. Since the wiring pattern is directly drawn, the electrodes can be formed at high positioning precision and desired discharging characteristics can be realized on the whole panel surface.

Although the embodiment has been described with respect to the example of the material containing silver, there is no problem even if a photosensitive material containing another metal is used. The invention is not limited to the YAG laser but there is no problem even if another laser such as excimer laser, argon ion laser, or the like is used.

The same shall also similarly apply to the following embodiments.

Figure 2:
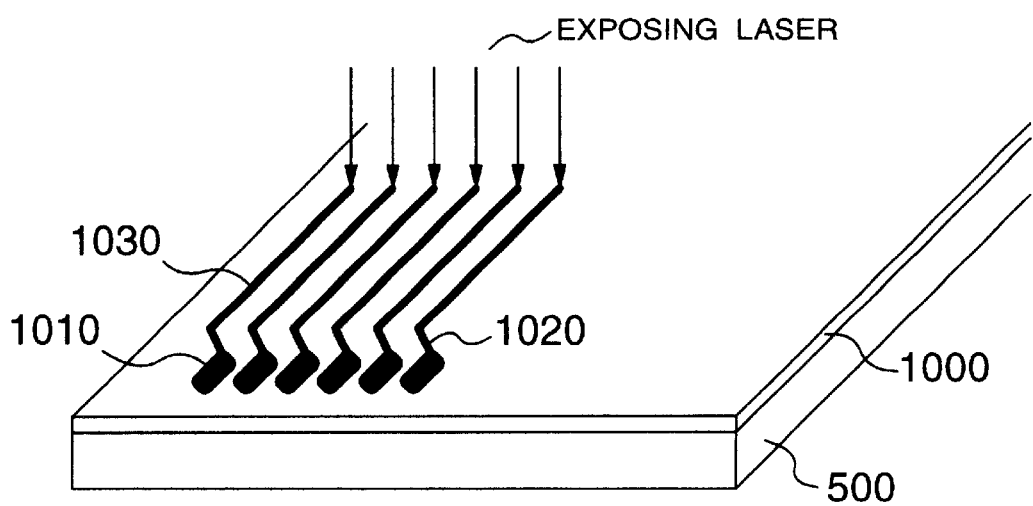
FIG. 2 is a cross sectional view showing the embodiment of the invention.

FIG. 2 is a whole diagram of the back substrate shown in FIG. 1.

As will be understood from the diagram, when address electrodes are formed on the back substrate, a plurality of electrodes are formed in parallel by using a plurality of beams. By adjusting a spot diameter (energy) of the laser, one wiring is exposed by one laser scan.

Generally, the address electrode has external connecting terminals 1010, leading wirings 1020, and wirings 1030 and a wiring width of each external connecting terminal 1010 is wider than that of each of the other wirings 1020 and 1030. Therefore, the external connecting terminals 1010 are exposed by beam scans of a plural number of times and, after that, the leading wirings 1020 and wirings 1030 are exposed by one successive beam scan, thereby improving a throughput.

On the other hand, among the lasers, there is a laser like a pulse laser in which an irradiating area is controlled on a dot unit basis. In this case, it is sufficient to control such that the beam is scanned in a predetermined direction and the laser is irradiated to an area to be exposed and the laser is not irradiated to an area which is not exposed.

Figure 3:
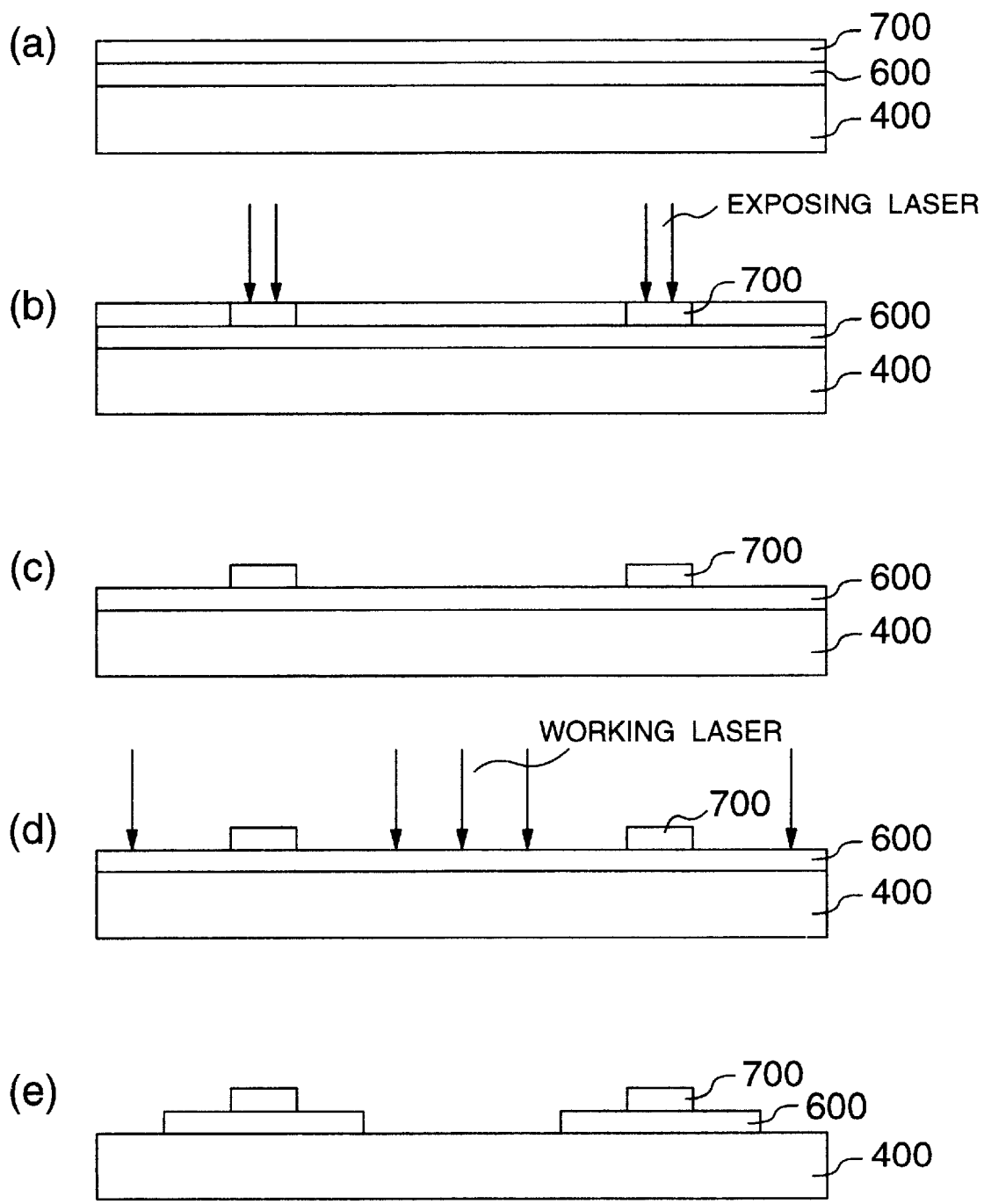
FIG. 3 is a cross sectional view showing the embodiment of the invention.
Figure 4:
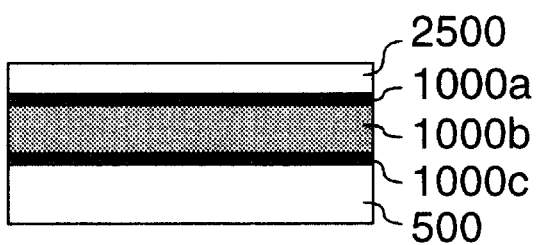
FIGS. 4 and 5 are conventional process diagrams.
Figure 4:
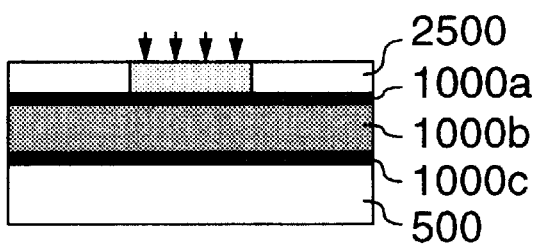
Figure 4:
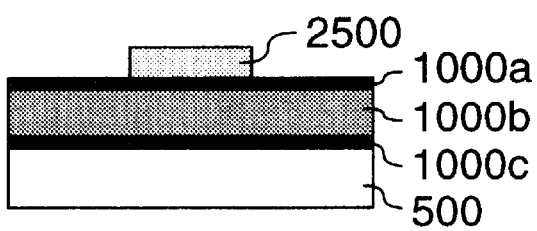
Figure 4:
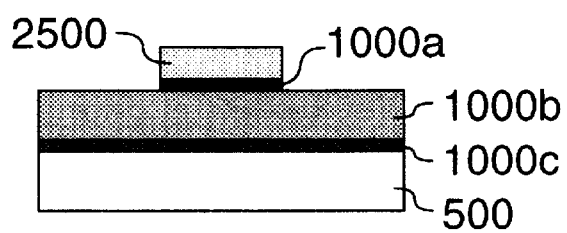
Figure 4:
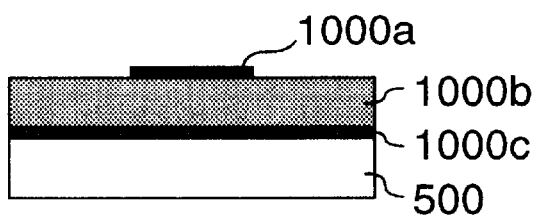
Figure 4:
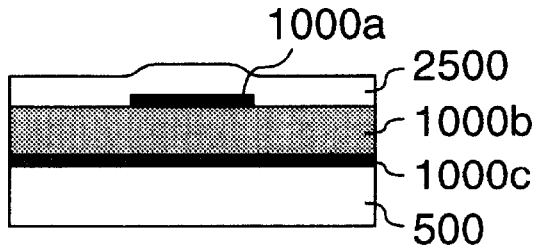
Figure 5:
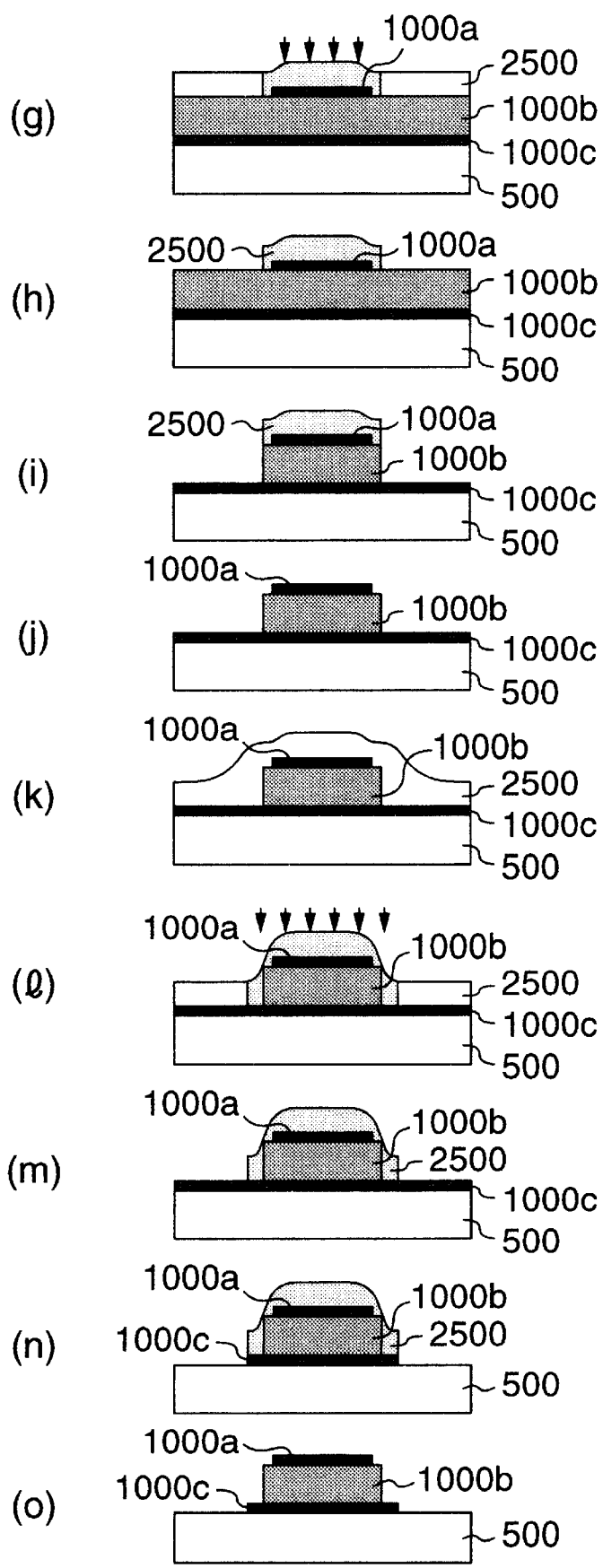
Figure 6:
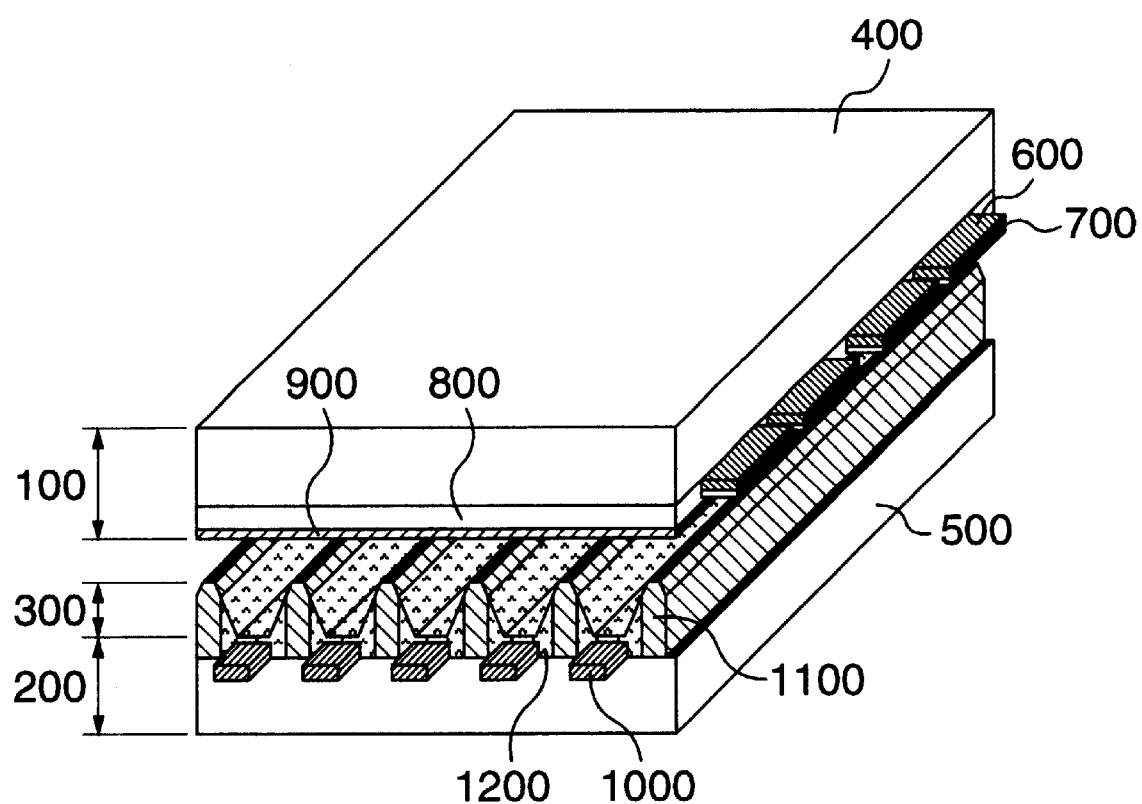
FIG. 6 is a cross sectional view showing a conventional gas discharge type display apparatus.

An example of the process of forming bus electrodes onto the front glass substrate will now be described with reference to FIG. 3.

First, materials forming the display electrodes 600 and bus electrodes 700 are sequentially formed as films onto the glass substrate 400 (step (a)). In this case, ITO serving as transparent electrodes is used as display electrodes 600 and a photosensitive silver material is used as bus electrodes 700. The ITO material is formed as a film by a film forming method such as sputtering method, evaporation deposition method, or the like. The silver material is coated by the dichoter and is formed as a film.

An exposing laser is subsequently irradiated to an area serving as a wiring pattern in the material layer containing silver (step (b)) and the irradiated area is developed, thereby forming the bus electrode 700 (step (c)) in a manner similar to the foregoing embodiment.

The area is worked so as to remove a predetermined area in the ITO layer by using a working laser (step (d)), thereby forming the display electrode 600 (step (e)).

After that, although not shown, the front substrate is completed by forming a dielectric layer and a protecting layer of MgO or the like. An insulating layer can be also formed between the glass substrate 400 and display electrode 600.

The bus electrode 700 is formed by the exposing and developing processes using the laser and the display electrode 600 is formed by the laser working process as mentioned above. Therefore, the conventional resist is unnecessary and the mask to form the resist is also unnecessary, so that the large reduction of the costs can be realized. Since the conventional etching process using the resist is not used as well, the defective disconnection or the like based on the etching process is eliminated. Since the electrodes can be formed at high positional precision, desired discharge characteristics can be realized on the whole panel surface.

Even if the display electrodes 600 are formed by etching or abrasive blasting using the resist, an advantage that is obtained by exposing and developing the bus electrodes 700 by using the laser is not lost.

According to the invention, processes of low costs in which the mask is unnecessary can be realized by working the material having photosensitivity by the directly drawing by the laser.

Since the electrodes can be formed at a desired position at high precision, a gas discharge type display apparatus of a high quality in which desired discharge characteristics are realized on the whole panel surface can be provided.

What is claimed is:

1. In a gas discharge type display apparatus, a method comprising the steps of:

providing a front substrate having a plurality of first electrodes and a back substrate having a plurality of second electrodes; and forming at least one of said first electrodes and said second electrodes by directly exposing a photosensitive material containing a conductive material in accordance with wiring patterns using a laser beam without using a mask, wherein said laser beam is of a third harmonic of a YAG laser.

2. In a gas discharge type display apparatus, a method comprising the steps of:

providing a front substrate having a plurality of first electrodes and a back substrate having a plurality of second electrodes; and forming at least one of said first electrodes and said second electrodes by exposing a photosensitive material containing a conductive material in accordance with wiring patterns having a wiring width corresponding to a spot diameter of a laser beam using a third harmonic of a YAG laser.

3. In a gas discharge type display apparatus, a method comprising the steps of:

providing a front substrate having a plurality of first electrodes and a back substrate having a plurality of second electrodes; and forming at least one of said first electrodes and said second electrodes by exposing a photosensitive material containing a conductive material by a laser beam scanning using a third harmonic of a YAG laser.

4. A method according to claim 3, wherein said conductive material includes silver.

5. A method according to claim 3, wherein said wiring includes a bus electrode.

6. A method according to claim 5, further comprising the step of forming said bus electrode by exposing said photosensitive material containing a silver by the laser beam scanning using a third harmonic of a YAG laser.

7. A method of manufacturing electrodes for use in a gas discharge type display apparatus, comprising the steps of:

providing a photosensitive material containing a conductive material on a substrate; and exposing the photosensitive material with wiring patterns by a laser beam scanning, wherein the laser beam is of a third harmonic of a YAG laser.

8. A method according to claim 7, wherein the conductive material includes silver.

9. A method according to claim 7, wherein the wiring includes a bus electrode.

10. A method of manufacturing electrodes for use in a gas discharge type display apparatus, comprising the steps of:

providing a photosensitive material containing a conductive material on a substrate; and exposing the photosensitive material with wiring patterns by a laser beam scanning in accordance with a third harmonic of a YAG laser.

11. A method of manufacturing electrodes for use in a gas discharge type display apparatus, comprising the steps of:

providing a photosensitive material containing a conductive material on a substrate; and exposing the photosensitive material with wiring patterns in accordance with a wiring width corresponding to a spot diameter of a laser beam using the third harmonic of a YAG laser.

12. A method of manufacturing electrodes for use in a gas discharge type display apparatus, comprising the steps of:

providing a photosensitive material containing a conductive material on a substrate; and exposing directly the photosensitive material with wiring patterns using a laser beam without using a mask, wherein said laser beam is of a third harmonic of a YAG laser.

13. A method according to claim 8, wherein said wiring includes a bus electrode.

14. A method according to claim 13, further comprising the step of forming said bus electrode by exposing said photosensitive material containing a silver by the laser beam scanning using a third harmonic of a YAG laser.

15. A method according to claim 1, wherein said wiring includes a bus electrode.

16. A method according to claim 15, further comprising the step of forming said bus electrode by exposing said photosensitive material containing a silver by the laser beam scanning using a third harmonic of a YAG laser.

17. A method according to claim 12, wherein the conductive material includes silver.

18. A method according to claim 10, wherein the conductive material includes silver.

19. A method according to claim 12, wherein the wiring includes a bus electrode.

20. A method according to claim 19, further comprising the step of forming said bus electrode by exposing said photosensitive material containing a silver by the laser beam scanning using a third harmonic of a YAG laser.

21. A method according to claim 10, wherein the wiring includes a bus electrode.

22. A method according to claim 21, further comprising the step of forming said bus electrode by exposing said photosensitive material containing a silver by the laser beam scanning using a third harmonic of a YAC laser.

23. A method according to claim 8, wherein said conductive material includes silver.

24. A method according to claim 1, wherein said conductive material includes silver.

* * * * *